United States Patent
Levy et al.

(10) Patent No.: US 11,605,649 B2
(45) Date of Patent: Mar. 14, 2023

(54) SWITCHES IN BULK SUBSTRATE

(71) Applicant: GLOBALFOUNDRIES U.S. Inc., Santa Clara, CA (US)

(72) Inventors: Mark D. Levy, Williston, VT (US); Siva P. Adusumilli, South Burlington, VT (US); Alvin J. Joseph, Williston, VT (US); Ramsey Hazbun, Colchester, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 0 days.

(21) Appl. No.: 17/306,078

(22) Filed: May 3, 2021

(65) Prior Publication Data
US 2022/0352210 A1 Nov. 3, 2022

(51) Int. Cl.
*H01L 27/12* (2006.01)
*H01L 21/762* (2006.01)
*H01L 23/66* (2006.01)
*H01L 21/8234* (2006.01)

(52) U.S. Cl.
CPC .... *H01L 27/1207* (2013.01); *H01L 21/76283* (2013.01); *H01L 21/823481* (2013.01); *H01L 23/66* (2013.01); *H01L 2223/6605* (2013.01)

(58) Field of Classification Search
CPC ........... H01L 27/1207; H01L 21/76283; H01L 21/823481; H01L 23/66; H01L 2223/6605; H01L 29/0653
USPC ....................................................... 257/347
See application file for complete search history.

(56) References Cited

U.S. PATENT DOCUMENTS

| | | | |
|---|---|---|---|
| 7,015,147 B2 | 3/2006 | Lee et al. | |
| 7,078,298 B2 | 7/2006 | Lee et al. | |
| 8,772,902 B2 | 7/2014 | Assefa et al. | |
| 10,192,779 B1 | 1/2019 | Shank et al. | |
| 10,388,728 B1 | 8/2019 | Zierak et al. | |
| 10,446,643 B2 | 10/2019 | Adusumilli et al. | |
| 10,529,854 B1 | 1/2020 | Verma et al. | |
| 2009/0315074 A1* | 12/2009 | Wang et al. | H01L 29/517 257/410 |
| 2018/0182845 A1* | 6/2018 | Seong et al. | H01L 29/0653 |

OTHER PUBLICATIONS

Monfray et al., "SON (silicon-on-nothing) technological SMOS platform: highly performant devices and SARM cells" IEEE, 2004, 4 pages.

* cited by examiner

Primary Examiner — Thinh T Nguyen
(74) Attorney, Agent, or Firm — Francois Pagette; Andrew M. Calderon; Calderon Safran & Cole, P.C.

(57) ABSTRACT

The present disclosure relates to semiconductor structures and, more particularly, to switches in a bulk substrate and methods of manufacture. The structure includes: at least one active device having a channel region of a first semiconductor material; a single air gap under the channel region of the at least one active device; and a second semiconductor material being coplanar with and laterally bounding at least one side of the single air gap, the second semiconductor material being different material than the first semiconductor material.

8 Claims, 8 Drawing Sheets

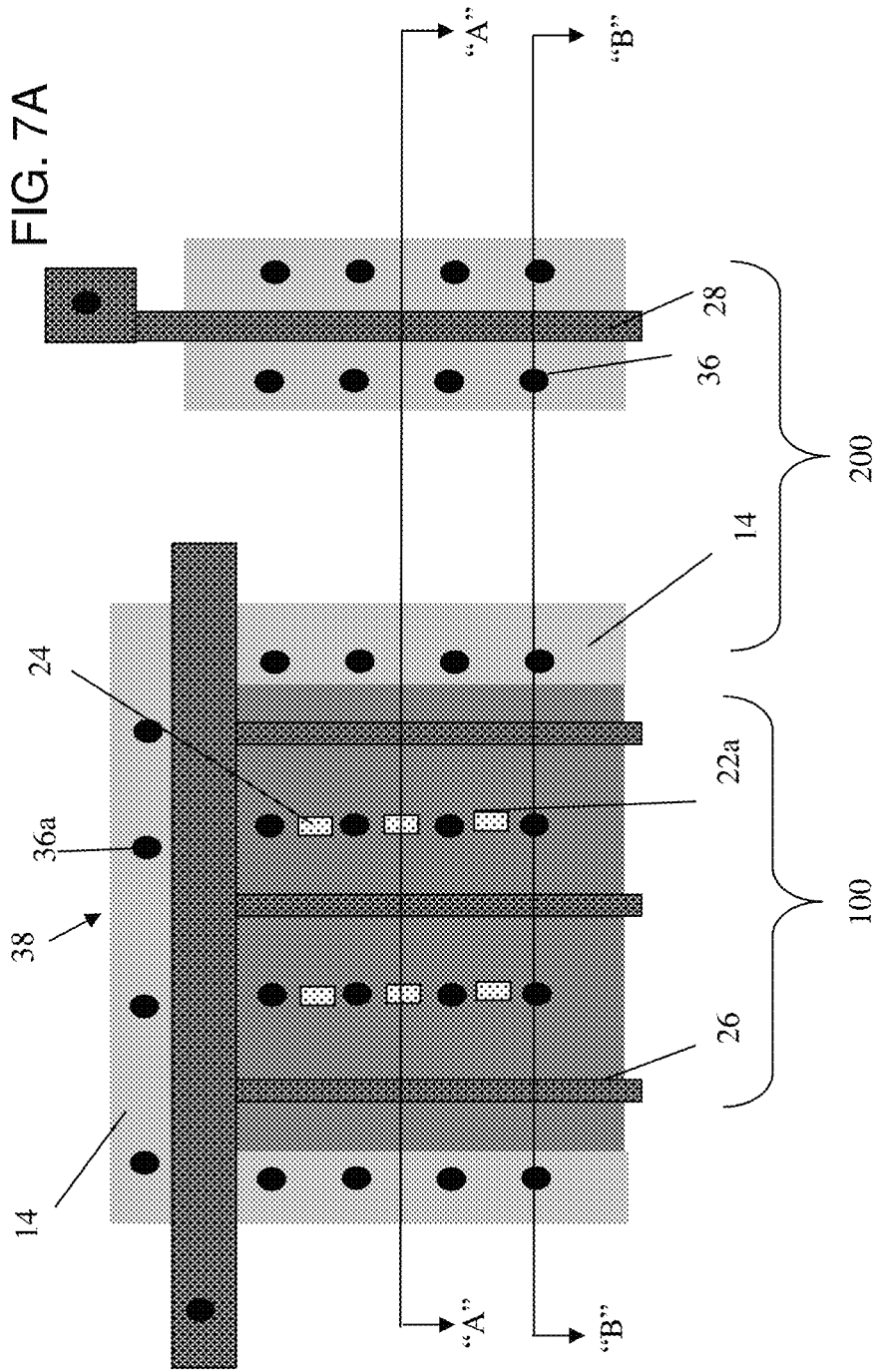

SWITCHES IN BULK SUBSTRATE

FIELD OF THE INVENTION

The present disclosure relates to semiconductor structures and, more particularly, to switches in a bulk substrate and methods of manufacture.

BACKGROUND

Radio frequency (RF) devices are used in many different types of communication applications. For example, RF devices may be used in cellular telephones with wireless communication components such as switches, MOSFETs, transistors and diodes. However, RF devices built on bulk Si substrates have been known to suffer from degraded linearity, harmonics, noise, parasitic loss and leakage currents, any of which will degrade device performance.

Currently, there is an increasing need to provide higher performance for the wireless communication components. To achieve this goal, state-of-the-art trap rich silicon on insulator (SOI) high resistivity substrates offer excellent vertical isolation and linearity, but the SOI wafer can be up to 50% of the total manufacturing cost because they may be 5 to 10 times the cost of high resistivity non-SOI substrates, i.e., a RF device formed on a SOI wafer could have a total normalized manufacturing cost of 1.0 while a similar device formed on a high resistivity non-SOI bulk wafer could have a total normalized manufacturing cost of 0.6. Accordingly, a significant fraction of the cost of manufacturing a RF switch, for example, is the cost to engineer very high linearity in SOI technologies.

SUMMARY

In an aspect of the disclosure, a structure comprises: at least one active device comprising a channel region of a first semiconductor material; a single air gap under the channel region of the at least one active device; and a second semiconductor material being coplanar with and laterally bounding at least one side of the single air gap, the second semiconductor material being different material than the first semiconductor material.

In an aspect of the disclosure, a structure comprising: a first region comprising: a plurality of switches each of which comprise a channel region of semiconductor substrate and source/drain regions; a single air gap located under the channel region and extending to inner source/drain regions of the plurality of switches; and a semiconductor material coplanar with and bounding at least one side of the single air gap, the semiconductor material being different than the semiconductor substrate; and a second region devoid of the single air gap and comprising at least one device positioned over the semiconductor material.

In an aspect of the disclosure, a method comprises: forming at least one active device comprising a channel region of a first semiconductor material; forming a single air gap under the channel region of the at least one active device; and forming a second semiconductor material being coplanar with and laterally bounding at least one side of the single air gap, the second semiconductor material being different material than the first semiconductor material.

BRIEF DESCRIPTION OF THE DRAWINGS

The present disclosure is described in the detailed description which follows, in reference to the noted plurality of drawings by way of non-limiting examples of exemplary embodiments of the present disclosure.

FIGS. 7A-7C show different views of the RF switches under the sealed air gap, amongst other features, and respective fabrication processes in accordance with aspects of the present disclosure.

DETAILED DESCRIPTION

The present disclosure relates to semiconductor structures and, more particularly, to switches in a bulk substrate and methods of manufacture. More specifically, the switches may be low Coff Radio Frequency (RF) switches in a high resistance bulk Si wafer technology. In embodiments, a lateral undercut or air gap is provided under the channel region of the RF switches. Advantageously, the lateral undercut or air gap provides selective reduction in parasitic capacitance (Cj+Csd-sx) by creating thin isolated body regions with voids (e.g., air gaps) under the active device region (e.g., channel region).

In more specific embodiments, a single lateral air gap may be provided underneath the channel region and inner source/drain regions of RF switches. In embodiments, the air gap will not extend under the outermost source/drain regions or the body contact region of the RF switches. For example, a Ge-rich material (or other semiconductor material with an etch selective to the material of the channel region) may remain under the body contact region and/or under outer source/drain regions of the RF switches. The Ge-rich material may be coplanar with the air gap and may laterally bound the air gap on one or more sides of the RF switches. In this way, the remaining Ge-rich material will not extend laterally beyond a patterned active shape of the RF switches, and hence may mechanically support the channel region of the RF switches. Moreover, shallow trench isolation (STI) regions may be adjacent to the Ge-rich material such that, in embodiments, the Ge-rich material is located in between STI regions and the air gap, itself. In embodiments, the air gap may also be filled or lined with an insulator material, e.g., oxide.

The switch of the present disclosure can be manufactured in a number of ways using a number of different tools. In general, though, the methodologies and tools are used to form structures with dimensions in the micrometer and nanometer scale. The methodologies, i.e., technologies, employed to manufacture the switch of the present disclosure have been adopted from integrated circuit (IC) technology. For example, the structures are built on wafers and are realized in films of material patterned by photolithographic processes on the top of a wafer. In particular, the fabrication of the switch uses three basic building blocks: (i) deposition of thin films of material on a substrate, (ii) applying a patterned mask on top of the films by photolithographic imaging, and (iii) etching the films selectively to the mask.

Figure 1:
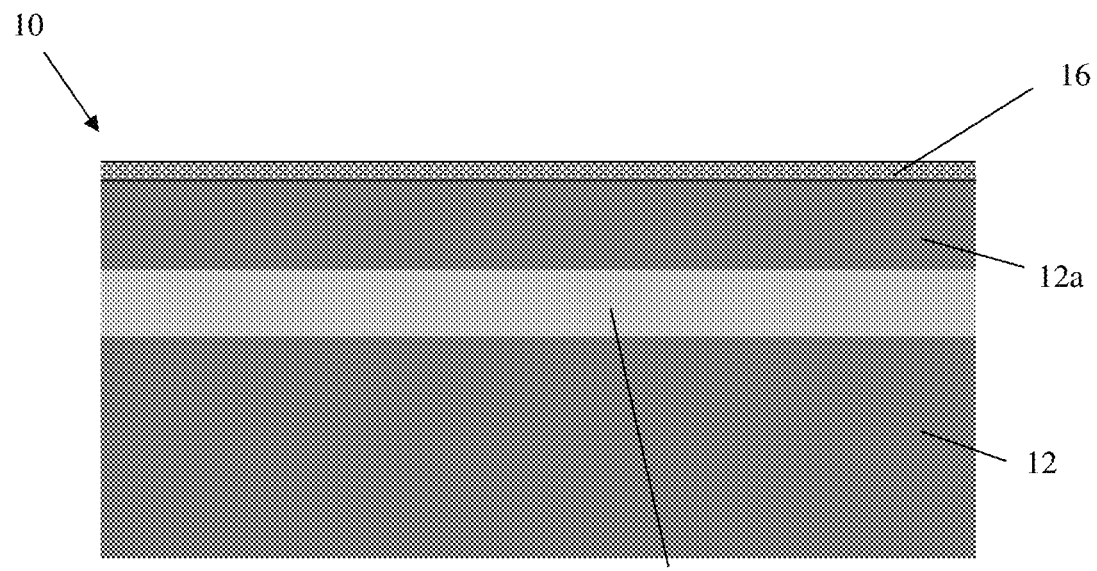
FIG. 1 shows a bulk substrate, amongst other features, and respective fabrication processes in accordance with aspects of the present disclosure.

FIG. 1 shows a bulk substrate, amongst other features, and respective fabrication processes. More specifically, FIG. 1 shows a structure 10 composed of a semiconductor material 14 over a bulk substrate 12. In embodiments, the bulk substrate 12 is a different semiconductor material than the semiconductor material 14. For example, the bulk substrate 12 may be single crystalline Si material; although other suitable single crystalline semiconductor materials are contemplated for use with the switches. For example, the bulk substrate 12 may be composed of single crystalline SiC, GaAs, InAs, InP, and/or other III/V or II/VI compound semiconductors.

The semiconductor material 14 may be Ge-rich material or other semiconductor material with an etch selectivity to the bulk substrate 12. For example, the semiconductor material 14 is preferably Ge or SiGe. In embodiments, the Ge material may vary in percentage. For example, 20% Ge may be used in a SiGe layer of an approximate 2000 Å thickness; whereas, 35% Ge may be used in a SiGe layer of an approximate 500 Å thickness. In devices which are more defect tolerant, the semiconductor material 14 may be GaN or polysilicon as examples.

The semiconductor material 14 may be formed by an epitaxial growth process on the surface of the bulk substrate 12 as is known in the art such that no further explanation is required for a complete understanding of the present disclosure. In the polysilicon implementation, an argon implant may be used to form defects in the bulk substrate 12 followed by an annealing process (thereby resulting in a polysilicon layer in the bulk substrate 12). The semiconductor material 14 may be deposited to a thickness of about 500 Å to about 3000 Å, and preferably about 1000 Å. It should be recognized, though, that the semiconductor material 14 may be deposited to other thicknesses depending on the desired device isolation and, hence, performance.

Still referring to FIG. 1, a bulk semiconductor material 12a may be formed over the semiconductor material 14. In embodiments, the bulk semiconductor material 12a is preferably a same material as the bulk substrate 12, which has an etch selectivity to the semiconductor material 14. The bulk semiconductor material 12a can be formed by an epitaxial growth process, which is self-planarizing. The bulk semiconductor material 12a may have a thickness of about 750 Å to 1500 Å which, due to this thin layer (compared to approximately 3000 Å used in known devices), will provide a selective reduction in parasitic capacitance.

In the polysilicon implementation (for semiconductor material 14), the bulk semiconductor material 12a can be recrystallized during the anneal process to form a single crystalline material as is known in the art such that no further explanation is required for a complete understanding of the present disclosure. In alternative embodiments, the bulk semiconductor material 12a can be formed before or after the argon implant. In further embodiments, the bulk semiconductor material 12a can be eliminated due to the polysilicon material being below a surface of bulk substrate 12 or, alternatively, a top surface recrystallizing during the annealing process.

FIG. 1 further shows a pad film 16 formed on the bulk semiconductor material 12a. In embodiments, the pad film 16 may be oxide/nitride films deposited by a conventional chemical vapor deposition (CVD) process. The pad film 16 may be used to assist in the formation of trenches with smooth or rounded edges, as one example.

Figure 2:
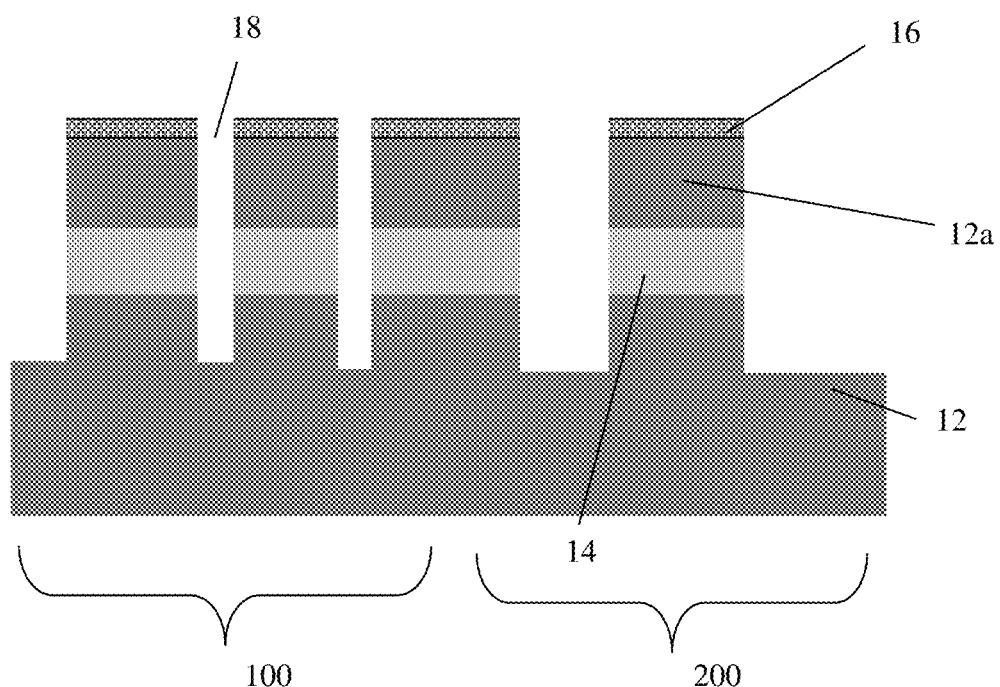
FIG. 2 shows trenches in the bulk substrate, amongst other features, and respective fabrication processes in accordance with aspects of the present disclosure.

In FIG. 2, trenches 18 are formed in a switch region 100 and transistor or other device region 200. In embodiments, the trenches 18 extend into the bulk substrate 12 and may be used to form a lateral undercut under the bulk semiconductor material 12a, in addition to forming shallow trench isolation structures. The trenches 18 may be formed by conventional lithography and etching methods known to those of skill in the art. For example, a resist formed over the pad film 16 is exposed to energy (light) to form a pattern (opening). An etching process with a selective chemistry, e.g., reactive ion etching (RIE), will be used to form one or more trenches 18 through the openings of the resist. The resist may then be removed by a conventional oxygen ashing process or other known stripants.

Figure 3:
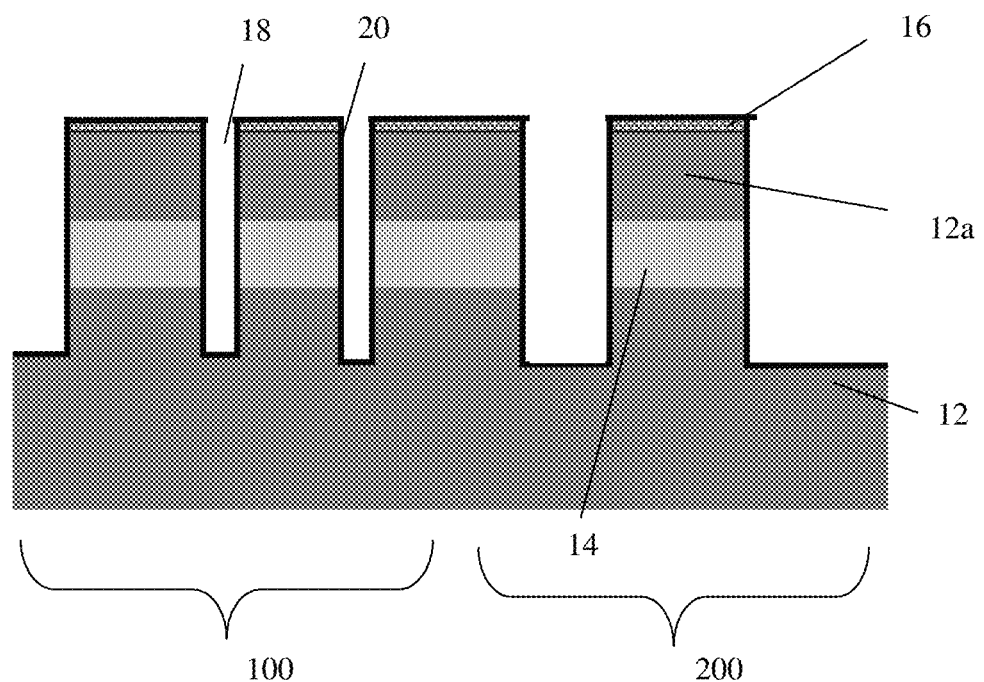
FIG. 3 shows a liner material within the trenches, amongst other features, and respective fabrication processes in accordance with aspects of the present disclosure.

In FIG. 3, a hardmask material 20 may be formed on sidewalls and a bottom surface of the trenches 18, as well as over a surface of the pad film 16 in regions 100, 200. In embodiments, the hardmask material 20 may be an oxide material. More specifically, the hardmask material 20 may be $SiO_2$. The hardmask material 20 may be deposited by a conventional chemical vapor deposition (CVD) method.

Figure 4:
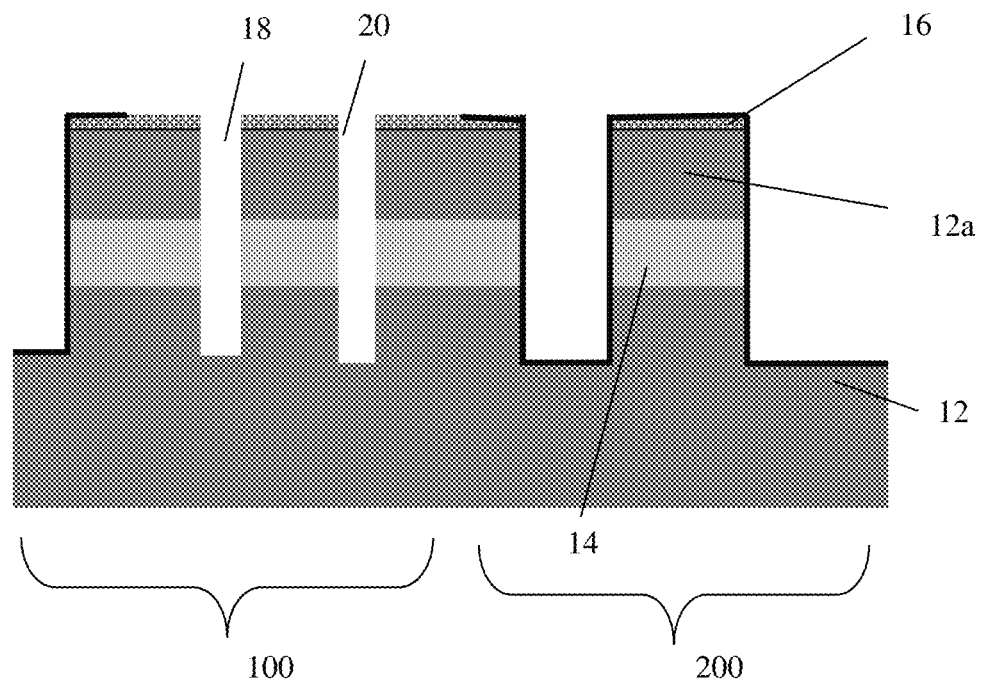
FIG. 4 shows partial removal of the liner material, amongst other features, and respective fabrication processes in accordance with aspects of the present disclosure.

As shown in FIG. 4, the hardmask material 20 may be removed from the trenches 18 and selected locations on the pad film 16 in region 100. For example, the hardmask material 20 may be removed from the trenches 18 and partially over the pad film 16 in region 100, leaving a slight overlap over the semiconductor material 14. In embodiments, the removal of the hardmask material 20 from with the trenches 18 in region 100 will expose the semiconductor material 14 within the trenches 18, which allows for removal of the semiconductor material 14 in subsequent fabrication processes.

In embodiments, the hardmask material 20 may be removed by conventional lithography and etching processes using a selective etch chemistry. For example, a resist with openings is formed over the hardmask material 20 in region 100. The resist will partially overlap the semiconductor material 14 in region 100, in addition to protecting the hardmask material 20 in region 200. An etching process with a selective chemistry will be used to remove the exposed hardmask material 20 in region 100 through the openings of the resist. For example, the hardmask material 20 may be removed by using a wet oxide etchant, e.g., a buffered HF wet etch. In embodiments, the buffering agent may be ammonium fluoride ($NH_4F$). The resist may be removed by a conventional oxygen ashing process or other known stripants.

Figure 5:
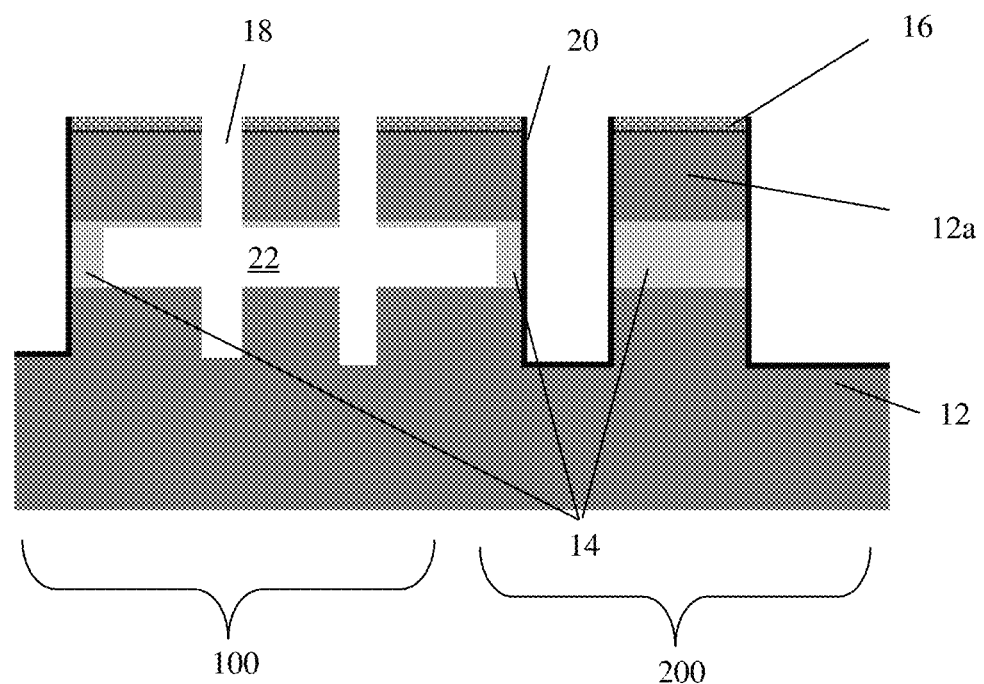
FIG. 5 shows a lateral undercut in the bulk substrate, amongst other features, and respective fabrication processes in accordance with aspects of the present disclosure.

In FIG. 5, the semiconductor material 14 may be partially removed in region 100 to form a lateral undercut 22 which, when sealed, will form a single air gap under a channel region and inner source/drain regions of RF switches. In embodiments, the semiconductor material 14 may be partially removed by a timed etch process with a selective chemistry starting from the exposed semiconductor material 14 within the trenches 18 as an entry point. For example, the semiconductor material 14 may be removed by a dry or wet etch process with an etchant chemistry selective to the semiconductor material 14, i.e., an etchant that will not attack the hardmask material 20 and bulk substrate 12. In embodiments, the etchant chemistry may be a Cl chemistry which will attack the semiconductor material 14, e.g., SiGe.

Alternatively, a plasma etch (dry etch) or an HCL dry chemical vapor etch without plasma may be used to remove the semiconductor material 14.

As further shown in FIG. 5, the timed etching process will leave semiconductor material 14 on outer portions of the region 100 (e.g., two opposing sides of the lateral undercut 22), coplanar with the lateral undercut 22 (and soon to be formed air gap) and on one or more sides of RF switches that will be fabricated in subsequent fabrication processes. The remaining semiconductor material 14 may be used to support the channel region of a RF switch, formed in subsequent fabrication processes. Also, a thin layer of the bulk semiconductor material 12a will remain over the lateral undercut 22 which helps in the selective reduction in parasitic capacitance by creating thin isolated body regions under the active device region (e.g., channel region).

Figure 6:
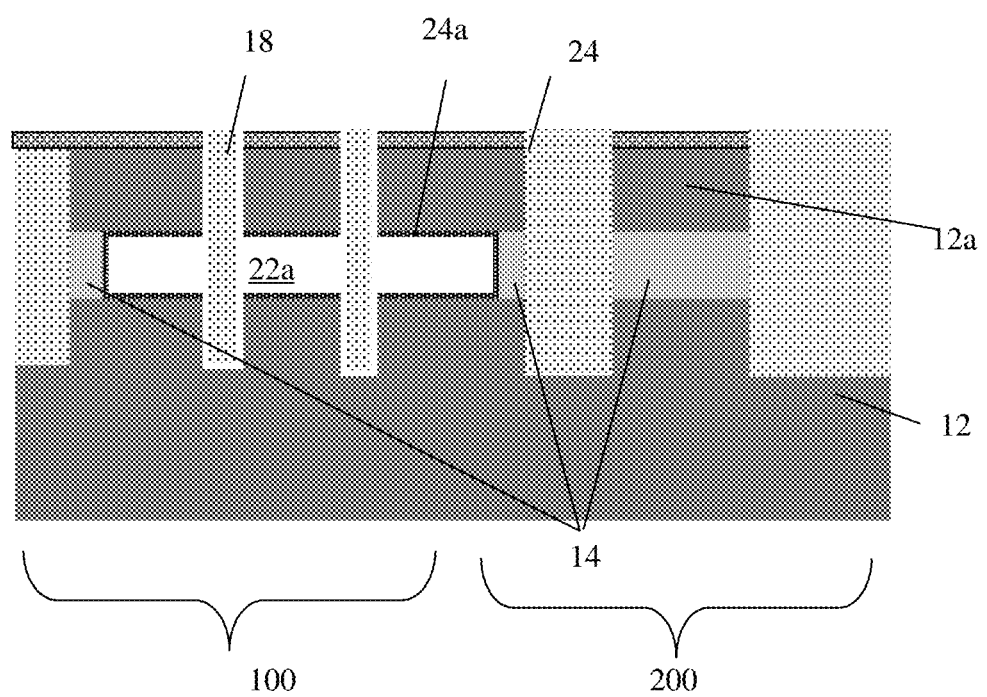
FIG. 6 shows a single sealed air gap, amongst other features, and respective fabrication processes in accordance with aspects of the present disclosure.

In FIG. 6, any remaining hardmask material 20 in regions 100, 200 may be removed using a selective chemistry. An insulator material 24 may be formed within the trenches 18 to form shallow trench isolation regions. In embodiments, the insulator material 24 may be an oxide material which also seals the lateral undercut to form an air gap 22a in region 100. In embodiments, the insulator material 24 may also line the air gap 22a or, alternatively, completely fill the air gap to form a silicon on insulator structure, both of which are shown representatively at reference numeral 24a. The insulator material 24 may be deposited by conventional deposition processes, e.g., CVD, followed by a planarization process, e.g., chemical mechanical polishing (CMP).

In alternative embodiments, the trenches 18 may be plugged or sealed with an epitaxial growth of semiconductor material to seal the air gap 22a. For example, Si may be epitaxially grown in the trenches 18 to seal the air gap 22a.

In either scenario of using an epitaxial semiconductor material or insulator material, remaining semiconductor material 14 may be coplanar with the air gap 22a and may laterally bound the air gap 22a on one or more sides of RF switches. For example, the semiconductor material 14 may remain under a body contact region and/or under outer source/drain regions of RF switches as described in more detail with respect to at least FIGS. 7A-7C. In this way, the air gap 22a will not extend laterally beyond the patterned active shape of the RF switches, as well as not extend past the lower edge in FIG. 7A. That is, the air gap 22a may be terminated at the shallow trench isolations structures. Also, the air gap 22a is of uniform depth formed in single crystal semiconductor material below the RF switches 26. Moreover, a single air gap 22a may encompass the area below a single RF switch or multi-finger RF switches.

Figure 7B:
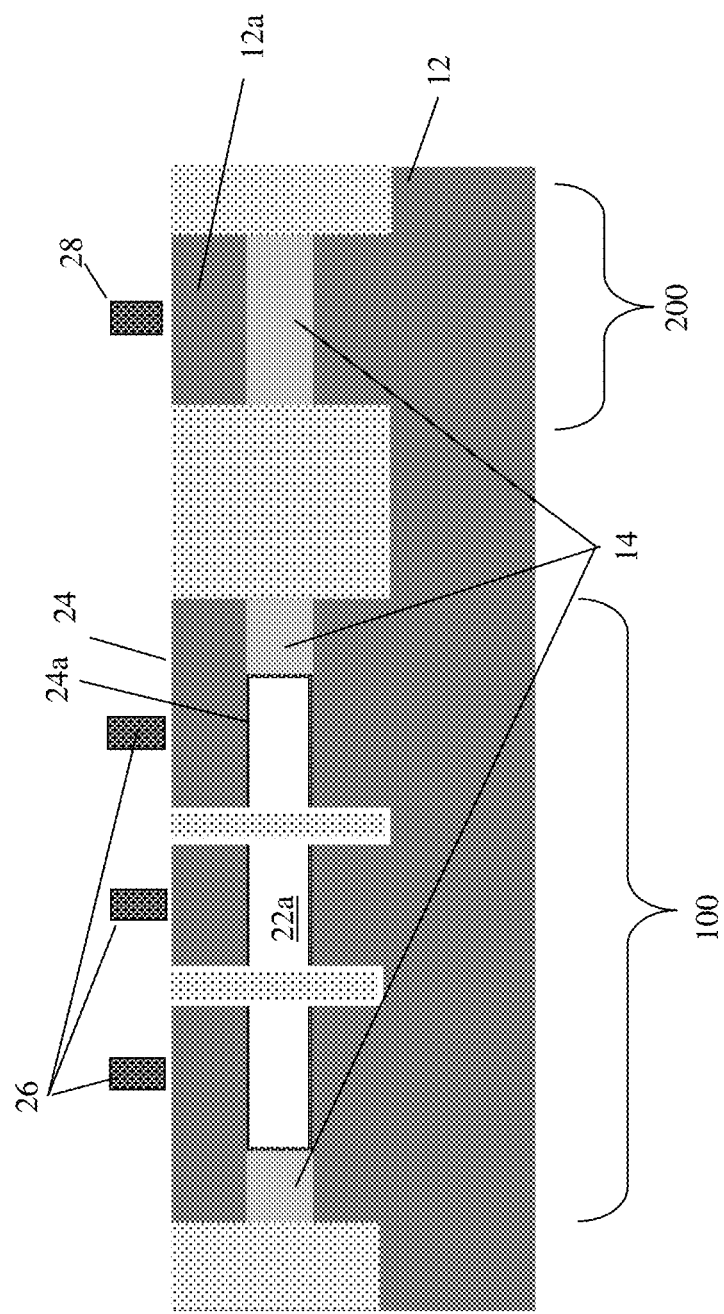
Figure 7C:
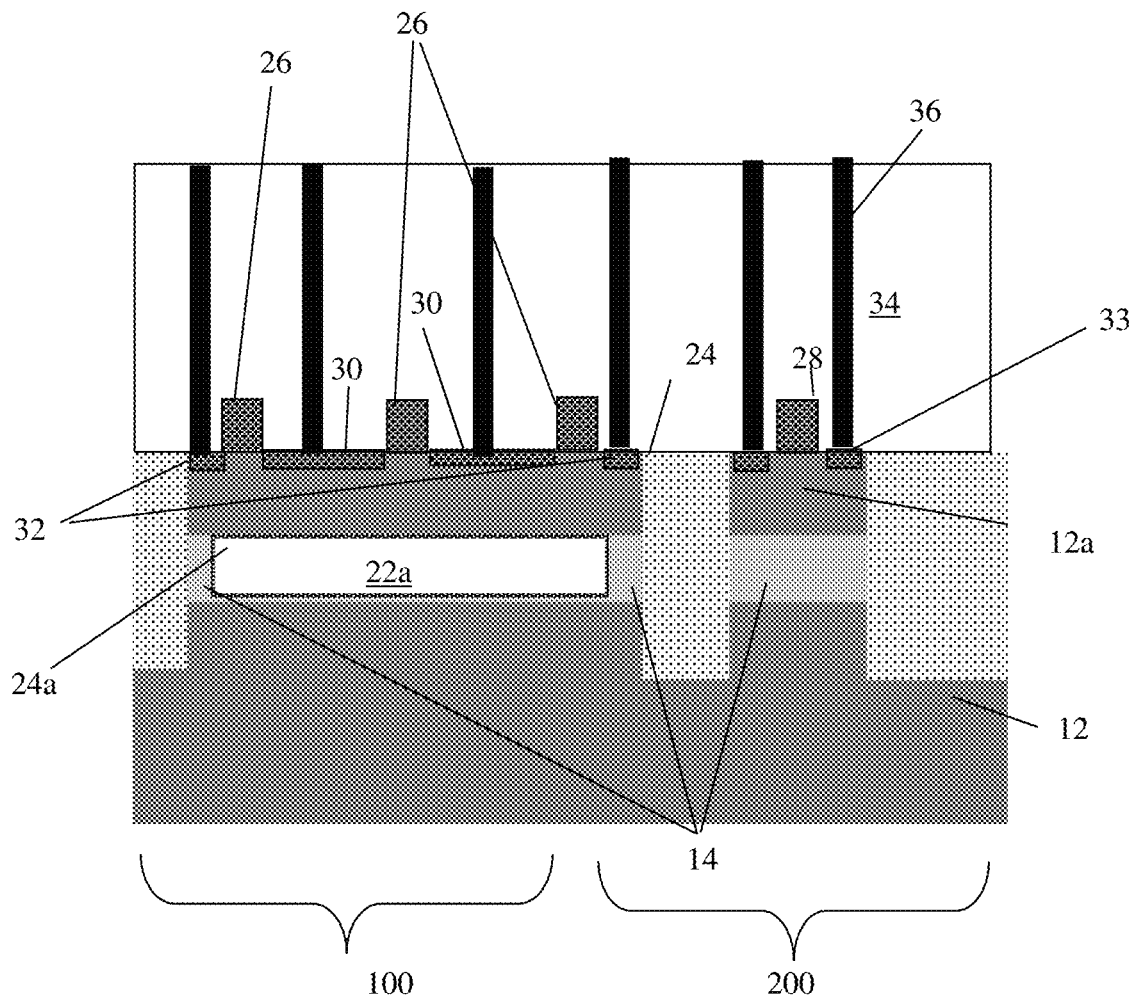

FIGS. 7A-7C show different views of RF switches and other devices, amongst other features, and respective fabrication processes. For example, FIG. 7A shows a top view of the RF switches and other devices; whereas, FIG. 7B shows a cross-sectional view along line "A"-"A" of FIG. 7A and FIG. 7C shows a cross-sectional view along line "B"-"B" of FIG. 7A. Referring to FIGS. 7A-7B, gate structures 26 are formed in region 100 and gate structures 28 are formed in region 200. In embodiments, the gate structures 26 may be RF switches formed over the air gap 22a; whereas, the gate structures 28 may be transistors or other devices formed over the semiconductor material 14 in region 200.

In embodiments, the gate structures 26, 28 may be fabricated using standard CMOS processes. In the standard CMOS processing, a gate dielectric material and polysilicon are formed, e.g., deposited, onto the bulk substrate 12a, followed a patterning process. In embodiments, the gate dielectric material can be a high-k gate dielectric material, e.g., $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. An insulator material such as nitride or oxide can be formed on the patterned materials, followed by an anisotropic etching process to form sidewalls.

Source/drain regions 30, 32, 33 may be formed on sides of the gate structures 26, 28. In embodiments, the source/drain regions 30, 32, 33 may include source and drain implants, extension implants and halo implants. The source/drain regions 30 may be inner source/drain regions for the RF switches 26 formed over the air gap 22a, the source/drain regions 32 may be outer source/drain regions for the RF switches 26, and the source/drain regions 33 may be source/drain regions for other devices 28 in region 200.

As shown in FIG. 7C, the source/drain regions 30 are above the air gap 22a and the source/drain regions 32, 33 are above the semiconductor material 14. That is, as the semiconductor material 14 is not completely removed to form the air gap 22a, the semiconductor material 14 will remain under active regions of the devices, e.g., gate structures 26, 28. This remaining semiconductor material 14 may be used to provide mechanical integrity on sides of air gaps 22a. Also, it should be recognized that the vertical edges of the source/drain region 30, 32, 33 can be reduced due to the thickness of the bulk semiconductor material 12a and the underlying air gap 22a. Moreover, by implementing the isolation feature, e.g., air gap 22a, and by reducing the thickness of the vertical edge of the source/drain regions 30 to that of the bulk semiconductor material 12a, e.g., 750 Å to 1500 Å, it is now possible to achieve a reduction of about 50-75% in parasitic capacitance.

The source/drain regions may be formed using any known fabrication processes, i.e., ion implantation, such that no further explanation is required herein for a complete understanding of the present disclosure. In embodiments, an artifact from source/drain implants may or may not exist below air gap 22a. And, although not critical to the understanding of the present disclosure, p-type and/or n-type wells can also be formed in the bulk substrate 12, 12a, depending on the particular devices and desired device performance characteristics.

Contacts 36 may be formed in electrical contact with the source/drain regions 30, 32, 33, in addition to body contacts 36a provided in electrical contact to wells in a body contact region 38. In the body contact region 38, the body contacts 36a may be electrically connected to a well underneath the gate structures 26, 28. The contacts 36, 36a are formed in trenches within an interlevel dielectric material 34 using conventional lithography, etching and deposition methods as already described herein. The contacts 36, 36a may be tungsten or aluminum; although other conductive materials are also contemplated herein.

As shown in FIG. 7A, for example, the contacts 36a may be in a body contact region 38 over the semiconductor material 14. The contacts 36 may also be over the outermost source/drain regions 32, which are also over the semiconductor material 14. In addition, the contacts 36 may be over the source/drain regions in region 200.

Prior to forming the contacts 36, 36a the source/drain regions 30, 32, 33 and body of the gate structures may be subjected to a silicide process. As should be understood by those of skill in the art, the silicide process begins with deposition of a thin transition metal layer, e.g., nickel, cobalt or titanium, over fully formed and patterned semiconductor devices (e.g., doped or ion implanted source and drain regions and respective devices). After deposition of the material, the structure is heated allowing the transition metal to react with exposed silicon (or other semiconductor material as described herein) in the active regions of the semiconductor device (e.g., source, drain and gate contact region) forming a low-resistance transition metal silicide. Following the reaction, any remaining transition metal is removed by chemical etching, leaving silicide contacts in the active regions of the device. It should be understood by those of skill in the art that suicide contacts will not be required on the devices, when a gate structure is composed of a metal material.

Figure 8:
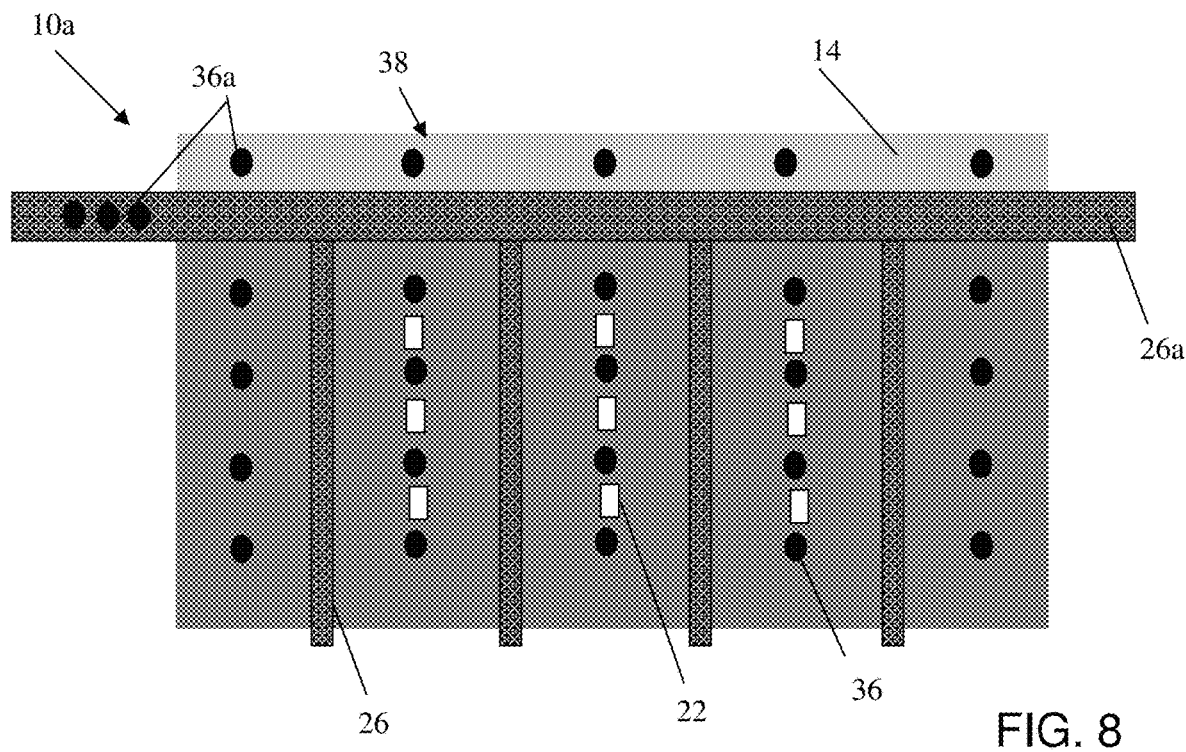
FIG. 8-10 show different switches and respective fabrication processes in accordance with additional aspects of the present disclosure.

FIG. 8 shows a structure 10a in which the semiconductor material 14 remains in the body contact region 38. In this embodiment, the semiconductor material 14 is removed from the outermost source/drain regions of the RF switches 26. The body contacts 36a are provided directly on the common gate body 26a and the body contact region 38, over the semiconductor material 14. The remaining features are similar to that disclosed with respect to FIGS. 1-7C.

Figure 9:
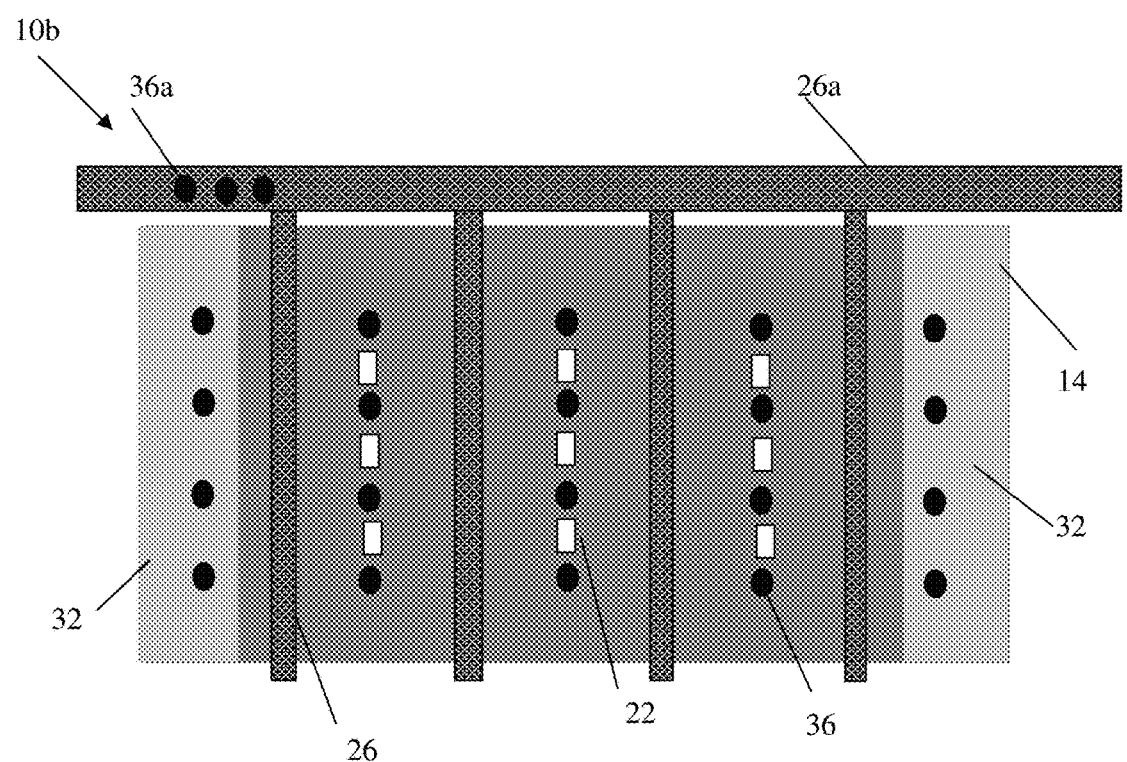

FIG. 9 shows a structure 10b in which the semiconductor material 14 is located at the outermost source/drain regions 32 of the RF switches 26. In this embodiment, the semiconductor material 14 is removed from the body contact region and the contacts 36a may be provided directly on the common gate body 26a of the RF switches 26, thereby resulting in a floating body device. The remaining features are similar to that disclosed with respect to FIGS. 1-7C.

Figure 10:
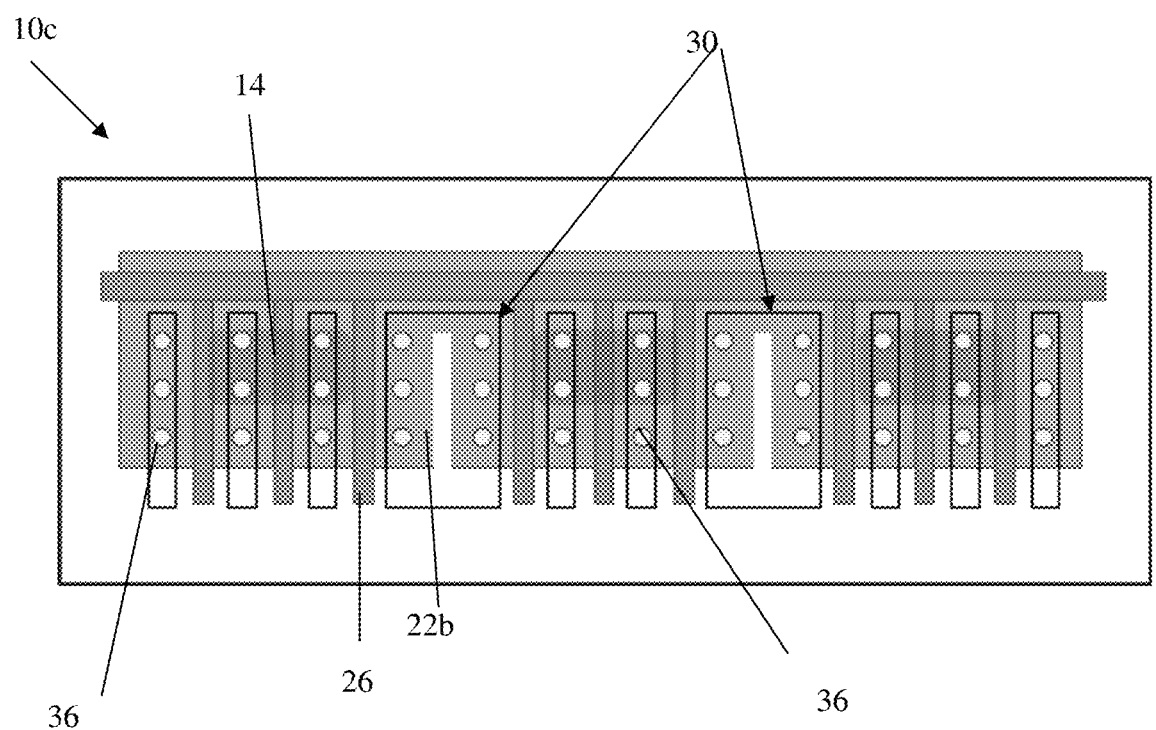

FIG. 10 shows a structure 10c in which slits 22a are formed in common source/drain regions 30 between adjacent RF switches 26. In this embodiment, the slits 22a can be used to form the lateral undercut in common diffusion regions of the RF switches 26. The slits 22a also allow the formation of the lateral undercut from all sides while leaving multiple pillars, e.g., the semiconductor material 14, at selected active regions of the RF switches 26. The slits 22a are provided at common source/drain regions of adjacent switches, and semiconductor material remain as pillars under channel regions of selected switches remote from the adjacent switches. The remaining features are similar to that disclosed with respect to FIGS. 1-7C.

The switch can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a first region comprising:
      a plurality of switches each of which comprise a channel region of semiconductor substrate and source/drain regions;
      a single air gap located under the channel region and extending to inner source/drain regions of the plurality of switches; and
      a semiconductor material coplanar with and bounding at least one side of the single air gap, the semiconductor material being different than the semiconductor substrate; and
   a second region devoid of the single air gap and comprising at least one device positioned over the semiconductor material.

2. The structure of claim 1, wherein the plurality of switches comprise radio frequency (RF) switches and the semiconductor material is under outermost source/drain regions of the RF switches.

3. The structure of claim 1, wherein the semiconductor material comprises Ge material and the semiconductor substrate comprises single crystalline Si material.

4. The structure of claim 1, further comprising shallow trench isolation structures extending below the single air gap, with insulator material of the shallow trench isolation structures sealing the single air gap.

5. The structure of claim 1, wherein the semiconductor material laterally bounds and supports the channel region and the single air gap does not extend laterally beyond a patterned active shape of the plurality of switches.

6. The structure of claim 5, wherein the semiconductor material remains under a body contact region of the plurality of switches.

7. The structure of claim 1, wherein the semiconductor material comprises material different than the semiconductor substrate.

8. The structure of claim 1, further comprising a slit adjacent to common source/drain regions of adjacent switches of the plurality of switches, and the semiconductor material remaining as pillars under channel regions of selected switches remote from the adjacent switches.

* * * * *